US012581663B2

(12) United States Patent
Farooq et al.

(10) Patent No.: US 12,581,663 B2
(45) Date of Patent: Mar. 17, 2026

(54) HETEROGENEOUS INTEGRATION STRUCTURE WITH VOLTAGE REGULATION

(71) Applicant: International Business Machines Corporation, Armonk, NY (US)

(72) Inventors: Mukta Ghate Farooq, Hopewell Jct, NY (US); Arvind Kumar, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 566 days.

(21) Appl. No.: 18/087,384

(22) Filed: Dec. 22, 2022

(65) Prior Publication Data

US 2024/0215270 A1 Jun. 27, 2024

(51) Int. Cl.
 *H10B 80/00* (2023.01)
 *H01L 23/00* (2006.01)
 (Continued)

(52) U.S. Cl.
 CPC ........... *H10B 80/00* (2023.02); *H01L 23/481* (2013.01); *H01L 23/528* (2013.01); *H01L 23/5386* (2013.01); *H01L 24/02* (2013.01); *H01L 24/08* (2013.01); *H01L 25/18* (2013.01); *H01L 24/16* (2013.01); *H01L 2224/02372* (2013.01);
 (Continued)

(58) Field of Classification Search
 CPC .................... H10B 80/00; H01L 25/18; H01L 2224/08145; H01L 25/0657; H01L 23/481; H01L 23/528; H01L 23/5386; H01L 24/02; H01L 24/08; H01L 24/16; H01L 2224/02372; H01L 2224/02373;
(Continued)

(56) References Cited

U.S. PATENT DOCUMENTS 8,053,873 B2 11/2011 Chauhan et al.
8,692,368 B2 4/2014 Pan et al.
(Continued)

FOREIGN PATENT DOCUMENTS

CN 114121891 A * 3/2022 ......... H01L 23/5386

OTHER PUBLICATIONS

D. Kim, J. Kung, S. Chai, S. Yalamanchili and S. Mukhopadhyay, "Neurocube: A Programmable Digital Neuromorphic Architecture with High-Density 3D Memory," 2016 ACM/IEEE 43rd Annual International Symposium on Computer Architecture (ISCA), 2016, pp. 380-392, doi: 10.1109/ISCA.2016.41.
(Continued)

*Primary Examiner* — Mamadou L Diallo
(74) *Attorney, Agent, or Firm* — Yuanmin Cai; Scully, Scott, Murphy & Presser, P.C.

(57) ABSTRACT

Heterogeneous integration semiconductor packages with voltage regulation are described. A semiconductor device can include a chip including a memory device and a plurality of through-silicon-vias (TSVs). The semiconductor device can further include a processor arranged on top of the chip. The processor can be configured to communicate with the memory device via a plurality of interconnects. The semiconductor device can further include at least one voltage regulator arranged on top of the chip. The at least one voltage regulator can be configured to regulate power being provided from the plurality of TSVs to the processor.

17 Claims, 9 Drawing Sheets

(51) Int. Cl.

| | |
|---|---|
| *H01L 23/48* | (2006.01) |
| *H01L 23/528* | (2006.01) |
| *H01L 23/538* | (2006.01) |
| *H01L 25/18* | (2023.01) |

(52) U.S. Cl.
CPC .............. *H01L 2224/02373* (2013.01); *H01L 2224/02381* (2013.01); *H01L 2224/08145* (2013.01); *H01L 2224/16225* (2013.01)

(58) Field of Classification Search
CPC . H01L 2225/06513; H01L 2225/06517; H01L 2225/06541
See application file for complete search history.

(56) References Cited

U.S. PATENT DOCUMENTS

| | | | |
|---|---|---|---|
| 8,982,563 | B2 | 3/2015 | Raj et al. |
| 9,048,112 | B2 | 6/2015 | Pan et al. |
| 9,101,068 | B2 | 8/2015 | Yun et al. |
| 9,229,466 | B2 | 1/2016 | Saraswat et al. |
| 9,831,148 | B2 | 11/2017 | Yu et al. |
| 10,096,582 | B2 | 10/2018 | Mantiply et al. |
| 11,211,378 | B2 | 12/2021 | Farooq et al. |
| 11,380,652 | B2 | 7/2022 | Choi et al. |
| 2011/0109382 | A1 | 5/2011 | Jin et al. |
| 2015/0242308 | A1 | 8/2015 | Kim et al. |
| 2016/0379686 | A1 | 12/2016 | Burger et al. |
| 2021/0335718 | A1* | 10/2021 | Cheah .................... H01L 23/13 |
| 2022/0278067 | A1* | 9/2022 | Tseng ..................... H01L 24/82 |
| 2023/0094979 | A1* | 3/2023 | Aleksov ................. H01L 23/50 |
| | | | 257/751 |
| 2023/0107103 | A1* | 4/2023 | Youn ...................... H01L 24/20 |
| | | | 257/777 |
| 2023/0197619 | A1* | 6/2023 | Loh ..................... H01L 23/5384 |
| | | | 257/774 |
| 2023/0207544 | A1* | 6/2023 | Loh .......................... H01L 24/16 |
| | | | 257/668 |
| 2023/0253381 | A1* | 8/2023 | Jeong ................... H01L 25/162 |
| | | | 361/782 |
| 2023/0260965 | A1* | 8/2023 | Li ........................... H01L 25/50 |
| | | | 257/668 |
| 2023/0268288 | A1* | 8/2023 | Tong .................... H01L 23/552 |
| | | | 257/659 |
| 2024/0023239 | A1* | 1/2024 | Kang .................. H05K 1/0296 |
| 2024/0038721 | A1* | 2/2024 | Chen ....................... H01L 24/08 |
| 2024/0113071 | A1* | 4/2024 | Liu ......................... H01L 24/32 |

OTHER PUBLICATIONS

Gao et al. "TETRIS: Scalable and Efficient Neural Network Acceleration with 3D Memory," ACM SIGARCH Computer Architecture News, vol. 45, Issue 1, Mar. 2017, pp. 751-764 https://doi.org/10.1145/3093337.3037702.

Hargrove, MJ et al., "Masterslice Logic Chip with Multilevel Power Circuits" Parent, RM; IBM TDB 06-80 p. 115-117; IP.com Electronic Publication Date: Feb. 13, 2005, 3 pages.

\* cited by examiner

700

702 — Form a plurality of TSVs on a frame of a memory power chip, the memory power chip includes the frame and a memory device 704 — Attach the memory power chip with the plurality of TSVs on top of a substrate 706 — Attach a processor and at least one voltage regulator to a top surface of the memory power chip

HETEROGENEOUS INTEGRATION STRUCTURE WITH VOLTAGE REGULATION

BACKGROUND

The present application relates to machine learning systems, and in particular to machine learning, and more particularly to a heterogeneous integration structure for artificial intelligence.

Workload of artificial intelligence applications increases as the amount and resolution of data increases. Accelerators can be designed and implemented to support processing of these large amounts of data. Accelerators can provide improved speed, power consumption, bandwidth, and other parameters relating to operations of artificial intelligence applications. In an aspect, accelerators are configured to perform specific tasks and provide outcomes of the tasks to memory chips. Hence, accelerators need to have high bandwidth interconnectivity with the memory to improve an overall efficiency and performance of the artificial intelligence applications.

SUMMARY

In one embodiment, a semiconductor device with voltage regulation is generally described. The semiconductor device can include a chip including a memory device and a plurality of through-silicon-vias (TSVs). The semiconductor device can further include a processor arranged on top of the chip. The processor can be configured to communicate with the memory device via a plurality of interconnects. The semiconductor device can further include at least one voltage regulator arranged on top of the chip. The at least one voltage regulator can be configured to regulate power being provided from the plurality of TSVs to the processor.

Advantageously, the semiconductor device in an aspect can provide voltage regulators that reduces voltage droop during power delivery to processors and memory devices integrated in the semiconductor device.

In one embodiment, a semiconductor device with voltage regulation is generally described. The semiconductor device can include a chip arranged on top of a substrate. The chip can include a memory device and a plurality of through-silicon-vias (TSVs). The memory device can be configured to store data associated with an artificial intelligence application. The semiconductor device can further include an accelerator arranged on top of the chip. The accelerator can be configured to communicate with the memory device via a plurality of interconnects. The accelerator can be configured to use data stored in the memory device to perform a specific task for the artificial intelligence application. The semiconductor device can further include at least one voltage regulator arranged on top of the chip. The at least one voltage regulator can be configured to regulate power being provided from the plurality of TSVs to the accelerator.

Advantageously, the semiconductor device in an aspect can provide voltage regulators that reduces voltage droop during power delivery to accelerators and memory devices integrated in the semiconductor device.

In one embodiment, a method for forming a semiconductor device with voltage regulators is generally described. The method can include forming a plurality of TSVs on a frame of a memory power chip. The memory power chip can include the frame and a memory device. The method can further include attaching the memory power chip with the plurality of TSVs on top of a substrate. The method can further include attaching a processor and at least one voltage regulator to a top surface of the memory power chip.

Advantageously, the method in an aspect can form a semiconductor device that provides voltage regulators that reduces voltage droop during power delivery to processors and memory devices integrated in the semiconductor device.

Further features as well as the structure and operation of various embodiments are described in detail below with reference to the accompanying drawings. In the drawings, like reference numbers indicate identical or functionally similar elements.

DETAILED DESCRIPTION

In some example heterogeneous integration packages, accelerators can be packaged in proximity to memory devices to provide high bandwidth communication between the memory device and the accelerator. Through-silicon-vias (TSVs) can be used for providing power from a power supply to the memory device and accelerator. However, voltage droop can occur as current flows through current paths that include TSVs and other wires, and voltage droop increases as the current path increases. Due to the voltage droop, the power being supplied to the memory device and/or accelerator can drop by the time the power reaches the memory device and accelerator.

Figure 1:
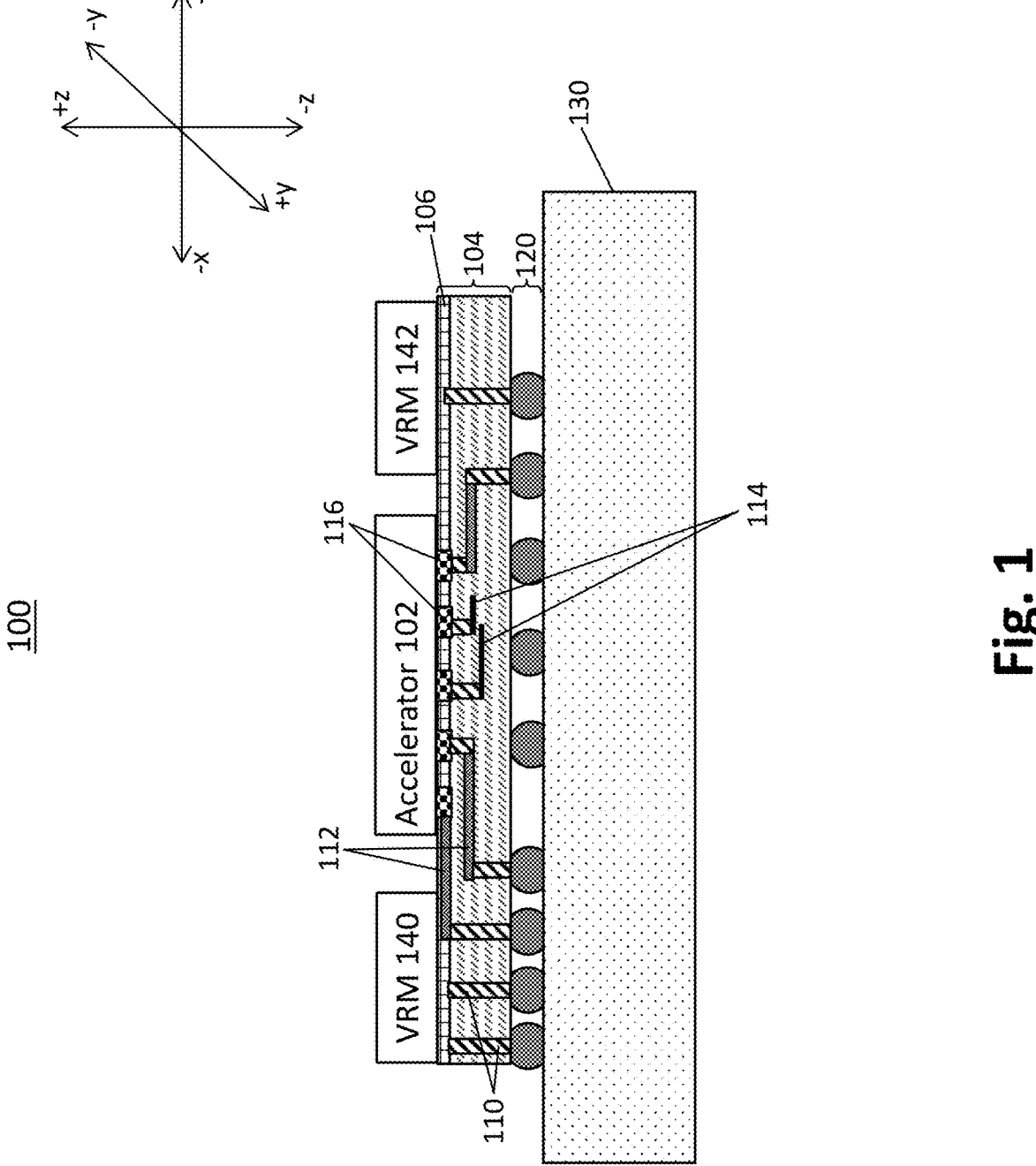
FIG. 1 illustrates an example structure that can implement heterogeneous integration structure with voltage regulation in one embodiment.

FIG. 1 illustrates an example structure 100 that can implement heterogeneous integration structure with voltage regulation in one embodiment. In one embodiment, structure 100 can be a heterogeneous integration structure, and structure 100 can be used for various applications, such as artificial intelligence computing. In one embodiment, structure 100 can be a three-dimensional (3D) semiconductor package including at least one layer of active electronic components that are stacked together and interconnected vertically and/or horizontally.

Structure 100 can include an accelerator chip 102 ("accelerator") and a memory power chip 104. Memory power chip 104 can be a semiconductor device that is a combination of a memory chip and a through-silicon vias (TSV) chip. The memory chip in memory power chip 104 can include one or more memory devices and/or elements, such as volatile memory devices, non-volatile memory devices, analog memory device that can perform in-memory computing, or other types of memory devices. In one embodiment, the memory chip in memory power chip 104 can be a three-dimensional (3D) stacked memory device. In one or more embodiments, the memory chip in memory power chip 104 can be a static random access memory (SRAM) chip (or chip stack) or a dynamic random access memory (DRAM) memory chip (or chip stack). In one embodiment, the memory chip in memory power chip 104 can be configured to store data associated with artificial intelligence applications, such as weights of an artificial neural network (ANN).

The TSV chip in memory power chip 104 can include a plurality of through-silicon vias (TSVs) 110 that are oriented vertically (e.g., ±z direction). Memory power chip 104 can further include a BEOL redistribution layer (RDL) 106 and at least one back-end-of-line (BEOL) inter-layer dielectric (ILD) layers underneath BEOL RDL 106 (e.g., –z direction). BEOL RDL layer 106, and the BEOL ILD layers underneath, can include BEOL wires of various sizes oriented horizontally (e.g., ±x direction). By way of example, BEOL ILD layers underneath BEOL RDL 106, and inside memory power chip 104, can include thick BEOL wires 112 and fine BEOL wires 114, where thick BEOL wires 112 can be thicker than fine BEOL wires 114. Further, in the embodiment shown FIG. 1, some thick BEOL wires 112 can be within the BEOL RDL 106. In one embodiment, accelerator 102 can communicate with the memory chip in memory power chip 104 via TSVs 110, thick BEOL wires 112, and fine BEOL wires 114. In one embodiment, BEOL wires in memory power chip 104 can be positioned in some of the top BEOL layers among the BEOL ILD layers, where the top-most BEOL layer faces the accelerator 102 in the +z direction.

Accelerator 102 can be, for example, one or more processors and/or analog circuit components configured to perform predefined tasks, such as addition, multiplication, multiply and accumulate (MAC) operations, vector operations, matrix operations, and/or other types of tasks that can be performed on data being stored in memory power chip 104. By way of example, if the memory chip in memory power chip 104 stores weights of an ANN, accelerator 102 can be a processor configured to perform a specific task using the stored weights. In one embodiment, accelerator 102 can be arranged in a face-to-face (F2F) configuration such that a face (e.g., the surface including circuit components) of accelerator 102 and a face of memory power chip 104 are facing one another. In one embodiment, memory power chip 104 can be connected to accelerator 102 via interconnects 116, where interconnects 116 can be copper-copper (Cu—Cu) bonds. Interconnects 116 can be embedded in the BEOL RDL 106. In one embodiment, accelerator 102 can be arranged on top of BEOL RDL 106 of memory power chip 104 in order to efficiently cool down during operations. By way of example, a heat sink (not shown) can be attached on top of accelerator 102 to cool accelerator 102.

In one embodiment, a plurality of solder bumps 120 can be attached on a bottom surface of memory power chip 104 to connect memory power chip 104 to a packaging substrate ("substrate") 130. Solder bumps 120 can be connected to TSVs 110 in memory power chip 104 in order to provide power from a laminate on substrate 130 to accelerator 102, the memory chip of memory power chip 104, and other components of memory power chip 104. In the embodiment shown in FIG. 1, power can be provided to accelerator 102 via current paths formed by TSVs 110, thick BEOL wires 112, and interconnects 116. In one embodiment, power can be provided to the memory chip in memory power chip 104 via current paths formed by TSVs 110, thick BEOL wires 112, and fine BEOL wires 114.

As current flows through various current paths towards accelerator 102 and/or memory chip of memory power chip 104, voltage droop (or IR droop) can occur and the voltage droop can cause power being provided to accelerator 102 and/or the memory chip in memory power chip 104 being less than intended. By way of example, if an initial amount of power is being provided to accelerator 102, the voltage droop can cause a lowered amount of power, instead of the initial amount of power, to reach accelerator 102. In an aspect, each one of TSVs 110, thick BEOL wires 112, and fine BEOL wires 114, can contribute to the voltage droop. In an aspect, lateral wires, such as thick BEOL wires 112 and thin BEOL wires 114, can contribute to the voltage droop more than TSVs 110.

To address the occurrence of voltage droop during power transfer from packaging substrate 130 to accelerator 102 and memory power chip 104, at least one voltage regulator modules (VRMs), such as a VRM 140 and VRM 142, can be placed on top of memory power chip 104. VRMs 140, 142 can be configured to regulate power being transferred to accelerator 102 and memory power chip 104. Thus, VRMs 140, 142 can compensate voltage droop by, for example, regulating power being transferred to accelerator 102 and memory power chip 104. By way of example, VRMs 140, 142 can convert voltage of power being delivered to accelerator 102 and/or the memory chip in memory power chip 104 into operating voltages of accelerator 102 and memory power chip 104.

In one embodiment, each one of VRMs 140, 142 can include a voltage regulator (e.g., linear voltage regulator or switching voltage regulator). Each one of VRMs 140, 142 can further include digital and analog components such as metal-oxide-semiconductor field-effect transistor (MOS-FETs), amplifiers, analog-to-digital converters (ADCs), digital to analog converters (DACs), and other components for facilitating voltage regulation. In one embodiment, each one of VRMs 140, 142 can include an embedded microcontroller configured to operate voltage regulators in VRMs 140, 142. In one embodiment, VRMs 140, 142 can include voltage regulators and the voltage regulators can be controlled by a controller external to VRMs 140, 142.

In one embodiment, VRMs 140, 142 can be configured to convert input voltages to fixed output voltages (e.g., by amplification). By way of example, VRM 140 can be programmed to output an operating voltage for accelerator 102. VRM 140 can accept or receive an input voltage from one or more TSVs 110 connected to VRM 140, and convert (e.g., amplify) the input voltage into the operating voltage for accelerator 102. VRM 140 can output the operating voltage for accelerator 102 via thick BEOL wires 112. Further, by way of example, VRM 142 can be programmed to output an operating voltage for memory chip in memory power chip 104. VRM 142 can accept or receive an input voltage from one or more TSVs 110 connected to VRM 142, and convert the input voltage into an operating voltage for the memory chip in memory power chip 104. VRM 142 can output the operating voltage for the memory chip in memory power chip 104 via thick BEOL wires 112. In one embodiment, since thick BEOL wires 112 and fine BEOL wires 114 can also cause voltage droop, VRMs 140, 142 can be programmed to output fixed voltages that are greater than the operating voltages of accelerator 102 and the memory chip in memory power chip 104. By way of example, if an expected voltage droop between an output of VRM 140 and accelerator 102 is X, then VRM 140 can be programmed to output a fixed voltage that compensates the voltage droop of X (e.g., the fixed voltage being a sum of the operating voltage of accelerator 102 and X). Further, since the current path to accelerator 102 and the memory chip in memory power chip 104 can be different, the expected voltage droop between output of VRM 142 an the memory chip, and the expected voltage droop between output of VRM 140 and accelerator 102, can be different as well.

Figure 2:
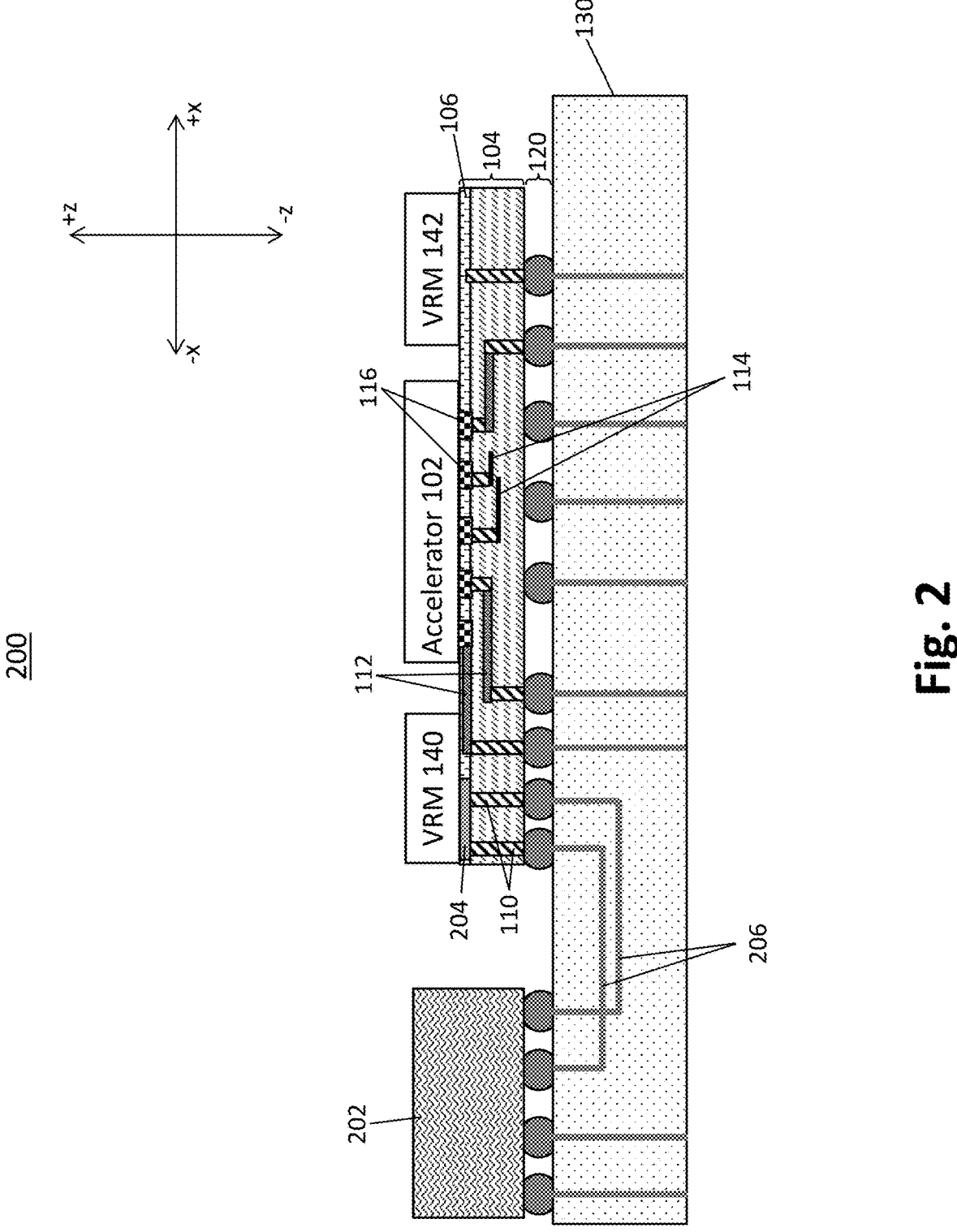
FIG. 2 illustrates another example structure that can implement heterogeneous integration structure with voltage regulation in one embodiment.

FIG. 2 illustrates another example structure 200 that can implement heterogeneous integration structure with voltage regulation in one embodiment. Structure 200 can be a heterogeneous integration structure, and structure 200 can be used for various applications, such as artificial intelligence computing. In one embodiment, structure 200 can be a 3D semiconductor package including at least one layer of active electronic components that are stacked together and interconnected vertically and/or horizontally.

Structure 200 can include accelerator 102, memory power chip 104, and a high bandwidth memory (HBM) device 202. HBM device 202 can be a memory device added to structure of FIG. 1 to provide memory capacity in addition to the memory chip in memory power chip 104. In the embodiment shown in FIG. 2, memory power chip 104 can further include a circuit 204, where circuit 204 can include at least a physical interface for HBM device 202 to interface with the memory chip in memory power chip 104, and a memory controller for controlling communications between HBM device 202 and the memory chip in memory power chip 104. By way of example, the memory controller in circuit 204 can control load and store operations between the memory chip in memory power chip 104 and HBM device 202. The physical interface in circuit 204 can include communication channels. Circuit 204 can be configured to perform power management, data management, feedback control, or other tasks associated with memory operations of the memory chip in memory power chip 104, and HBM device 202. In one embodiment, circuit 204 can be embedded in one or more of the BEOL ILD layers of memory power chip 104.

In one embodiment, HBM device 202 can communicate with memory chip of memory power chip 104 via paths 206 formed by a plurality of TSVs and/or wires embedded in substrate 130. Data and/or signals being communicated between HBM device 202 and the memory chip in memory power chip 104 can go through paths 206 and some of the TSVs 110 of memory power chip 104. By way of example, the memory controller in circuit 204 can retrieve data from the memory chip in memory power chip 104 and send the retrieved data to HBM device 202 via TSVs 110, solder bumps 120, and paths 206.

In one embodiment, VRM 140 can be on top of circuit 204 and on top of a portion of memory power chip 104 (e.g., in the +z direction). VRMs 140, 142 can be integrated at various locations on top of memory power chip 104 regardless of locations of additional components (e.g., circuit 204) within memory power chip 104. In one embodiment, TSVs 110 can be located on a periphery of memory power chip 104 and BEOL wires (e.g., thick BEOL wires 112 and/or fine BEOL wires 114) can connect TSVs 110 on the periphery to the VRMs 140, 142, accelerator 102, and memory chip in memory power chip 104.

Figure 3:
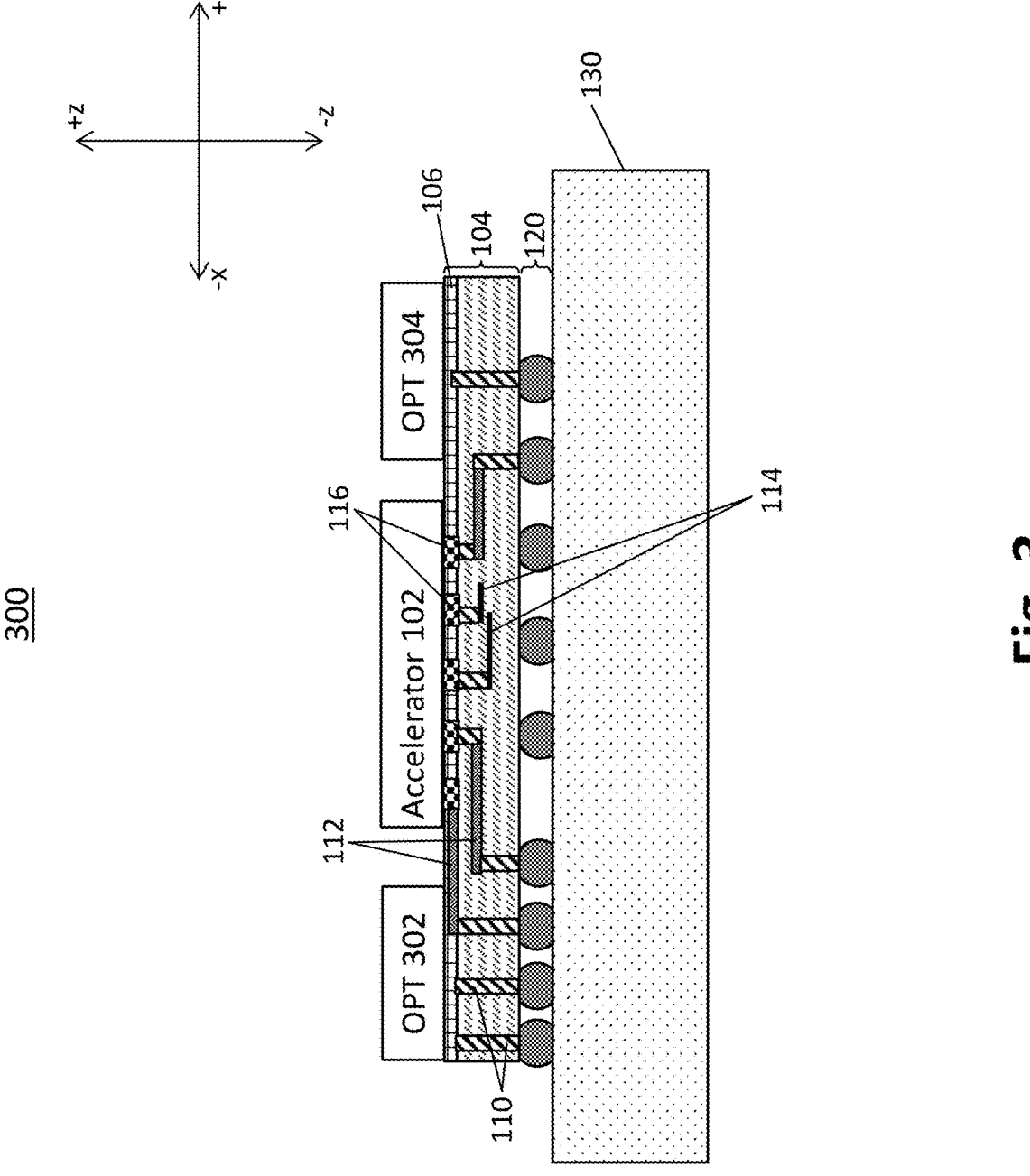
FIG. 3 illustrates another example structure that can implement heterogeneous integration structure with voltage regulation in one embodiment.

FIG. 3 illustrates another example structure 300 that can implement heterogeneous integration structure with voltage regulation in one embodiment. Structure 300 can be a heterogeneous integration structure, and structure 300 can be used for various applications, such as artificial intelligence computing. In one embodiment, structure 300 can be a 3D semiconductor package including at least one layer of active electronic components that are stacked together and interconnected vertically and/or horizontally.

Structure 300 can include accelerator 102, memory power chip 104, and at least one optical chip, such as optical chips 302, 304 (labeled as OPT). Each one of optical chips 302, 304 can include optical channels (e.g., optical fibers) and/or photonic components that can implement a transceiver. Optical chips 302, 304 can be configured to transmit relatively high voltages in an efficient manner (e.g., higher speed and reduced latency). In one embodiment, optical chips 302, 304 can be integrated with VRMs 140, 142 shown in FIG. 1 and FIG. 2, to transfer power represented as regulated voltages outputted by VRMs 140, 142, to accelerator 102 and memory power chip 104.

Figure 4:
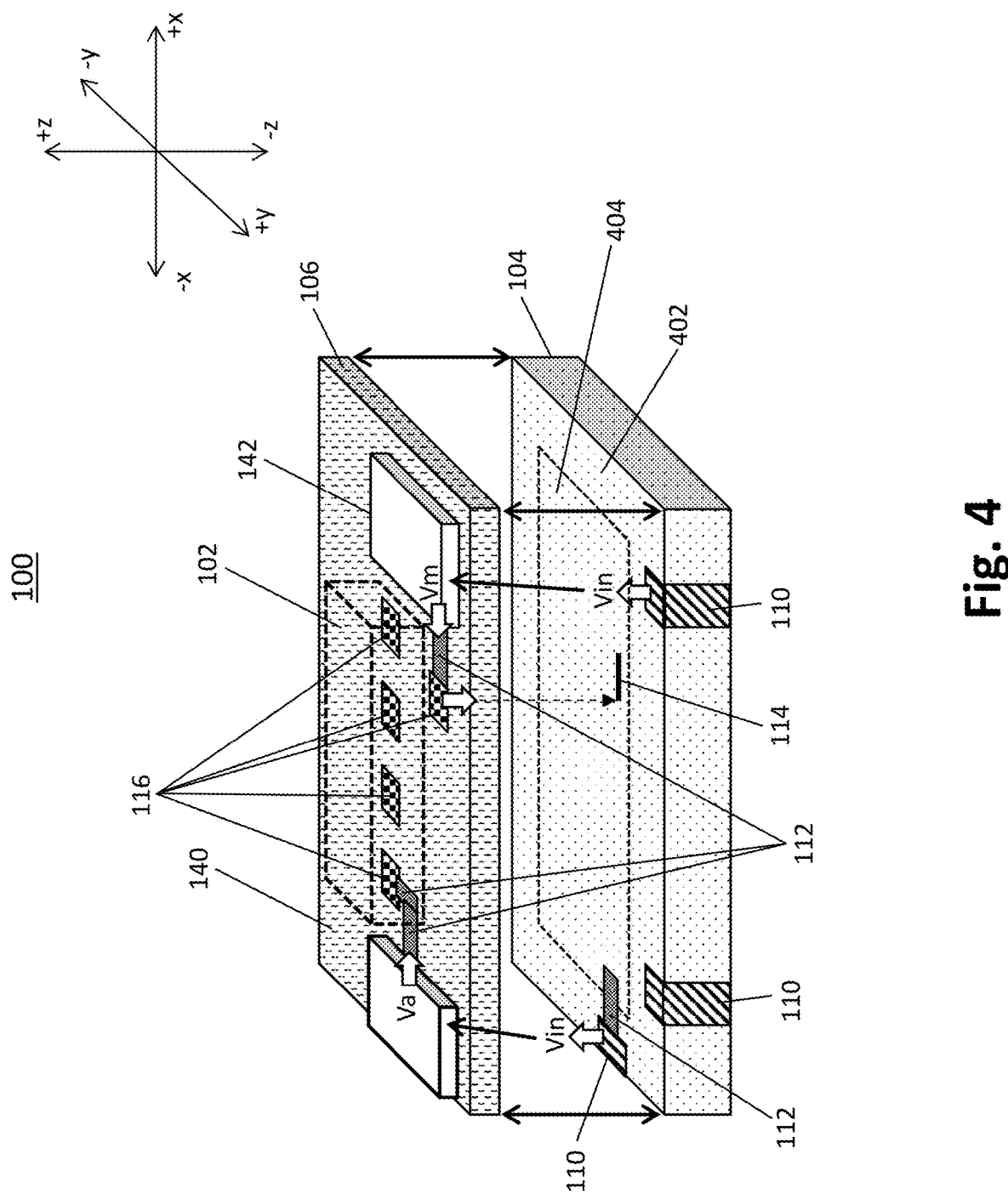
FIG. 4 illustrates a perspective view of the example structure in FIG. 1 in one embodiment.

FIG. 4 illustrates a perspective view of the example structure in FIG. 1 in one embodiment. In the perspective view shown in FIG. 4, TSVs 110 are located on a periphery of memory power chip 104. In one embodiment, memory power chip 104 can be formed by a frame 402 and a memory portion 404. Frame 402 can be a structure surrounding memory portion 404 across a x-y plane, and TSVs 110 can be located on a periphery of frame 402. Memory portion 404 can be a portion of memory power chip 104 that includes a memory chip having one or more memory devices or elements, such as layers of 3D stacked memory devices arranged in the ty direction. In one embodiment, memory power chip 104 can include BEOL wires, such as thick BEOL wires 112 and fine BEOL wires 114, to connect TSVs 110 to memory portion 404.

By having TSVs 110 on frame 402, or the periphery of memory power chip 104, a number of TSVs in a central area of memory power chip 104 can be reduced. For example, memory portion 404 can have a minimal amount of TSVs, thus allowing more memory elements to be embedded in memory portion 404 and reduces disruption to operations of the memory devices in memory portion 404.

In response to BEOL RDL 106 being arranged on top of memory power chip 104, TSVs 110 can be connected to BEOL wires in BEOL RDL 106 such that data and power can be distributed to accelerator 102 on top of BEOL RDL 106. In one embodiment, current carrying voltage Vin can be provided from TSV 110 to VRMs 140, 142. VRM 140 can convert Vin into a regulated voltage Va and provide regulated voltage Va to accelerator 102 via thick BEOL wires 112. VRM 142 can convert Vin into a regulated voltage Vm and provide regulated voltage Vm to memory portion 404 via thick BEOL wires 112, TSVs 110 and fine BEOL wires 114. In one embodiment, regulated voltage Vm can be provided to memory portion 404 via a path that includes thick BEOL wires 112 in BEOL RDL 106, TSVs 110 in frame 402, and fine BEOL wires 114 connecting TSVs 110 in frame 402 to memory portion 404. In one embodiment, regulated voltage Vm can be provided to memory portion 404 via a path that includes thick BEOL wires 112 in BEOL RDL 106, TSVs 110 that spans vertically (e.g., ±z direction) from BEOL RDL 106 to memory portion 404, and fine BEOL wires 114 embedded in memory portion 404. Since each one of VRMs 140, 142 can be configured to output individual regulated voltage level, one input voltage, such as Vin, can be provided to structure 100. In an aspect, the lateral distance (e.g., on the x-y plane) between VRM 140 and accelerator 102, and between VRM 142 and memory portion 404, can impact the voltage droop compensation. As the distance between VRMs 140, 142 and accelerator 102, memory portion 404 decreases, the amount of voltage droop contributed by the lateral wires can also decrease. Hence, it may be desirable to minimize the lateral distance between VRMs 140, 142 and accelerator 102, memory portion 404, respectively.

Figure 5A:
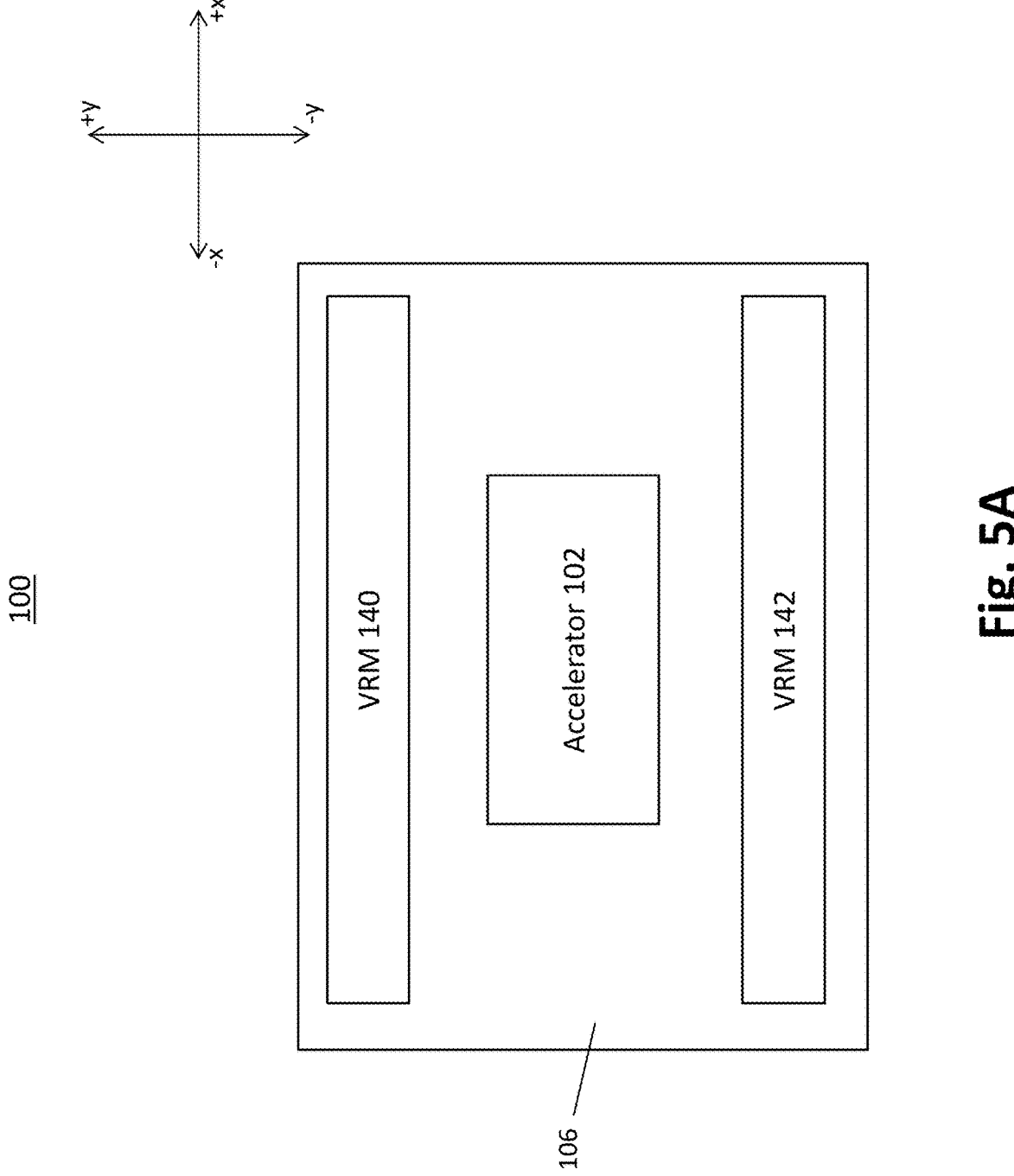
FIG. 5A illustrates a top view of the example structure of FIG. 1 in one embodiment.
Figure 5B:
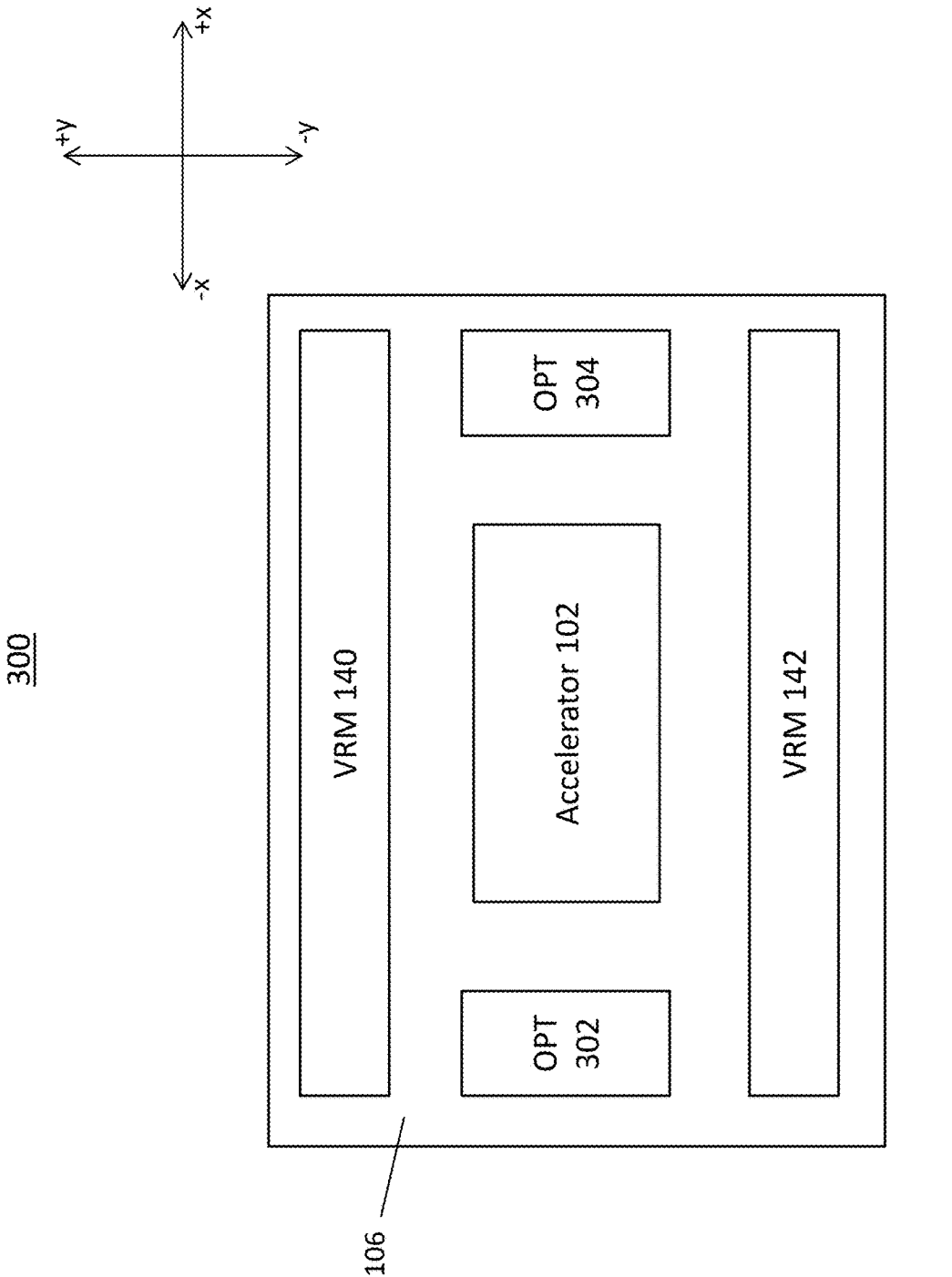
FIG. 5B illustrates a top view of the example structure of FIG. 3 in one embodiment.

FIG. 5A and FIG. 5B illustrate a top views of the example structure 100 in FIG. 1, and the example structure 300 in FIG. 3, respectively. In top view shown in FIG. 5A, VRMs 140, 142 and accelerator 102 can be arranged on top of BEOL RDL 106 of memory power chip 104. The size and the number of VRMs that can be arranged on structure 100 can be arbitrary and dependent on a desired implementation of structure 100. In FIG. 5B, additional components such as optical chips 302, 304 can be arranged on top of BEOL RDL 106 of memory power chip 104.

Figures 6A, 6B:
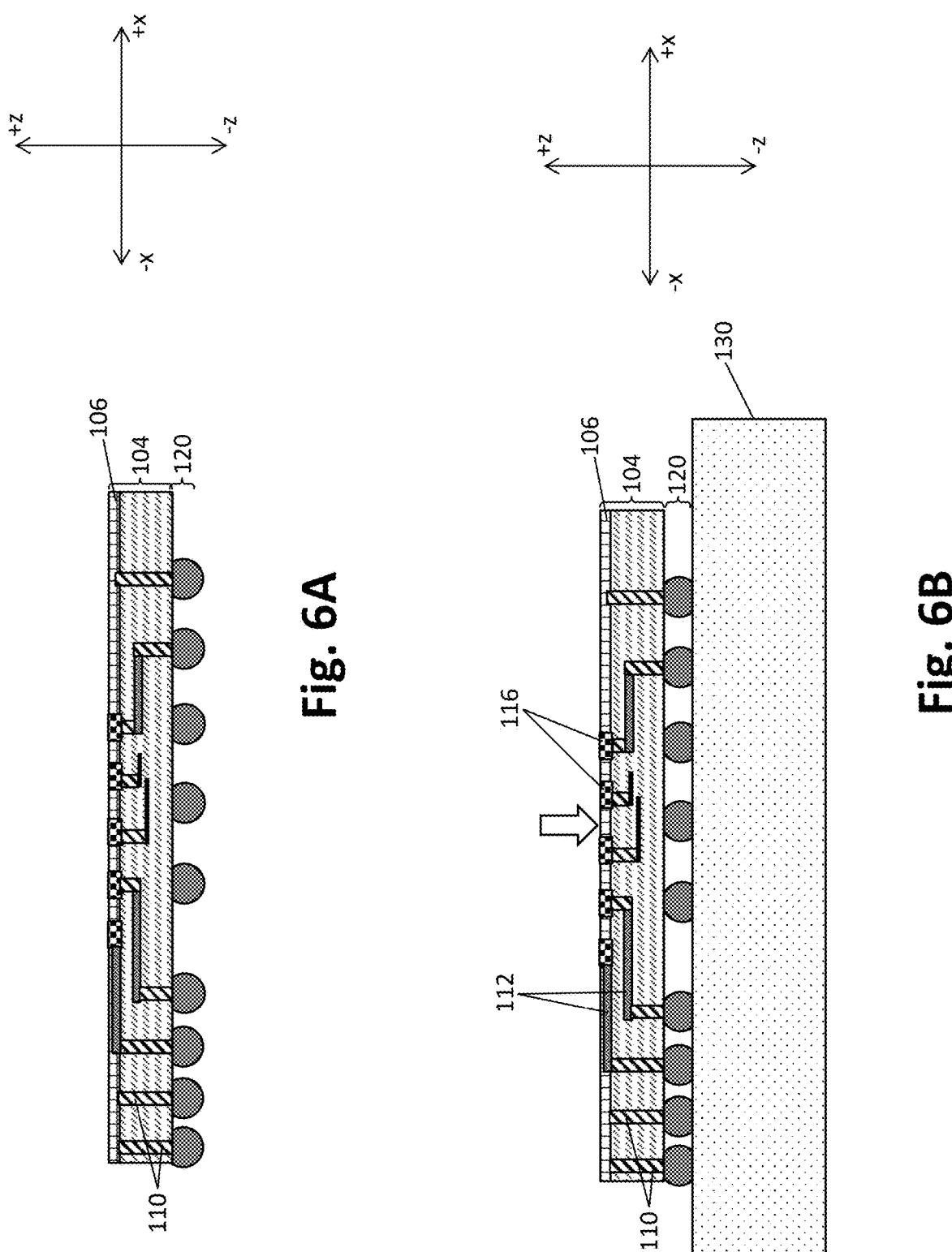
FIG. 6A illustrates a step of a process to form a heterogeneous integration structure with voltage regulation in one embodiment.
FIG. 6B illustrates another step of the process to form a heterogeneous integration structure with voltage regulation in one embodiment.
Figure 6C:
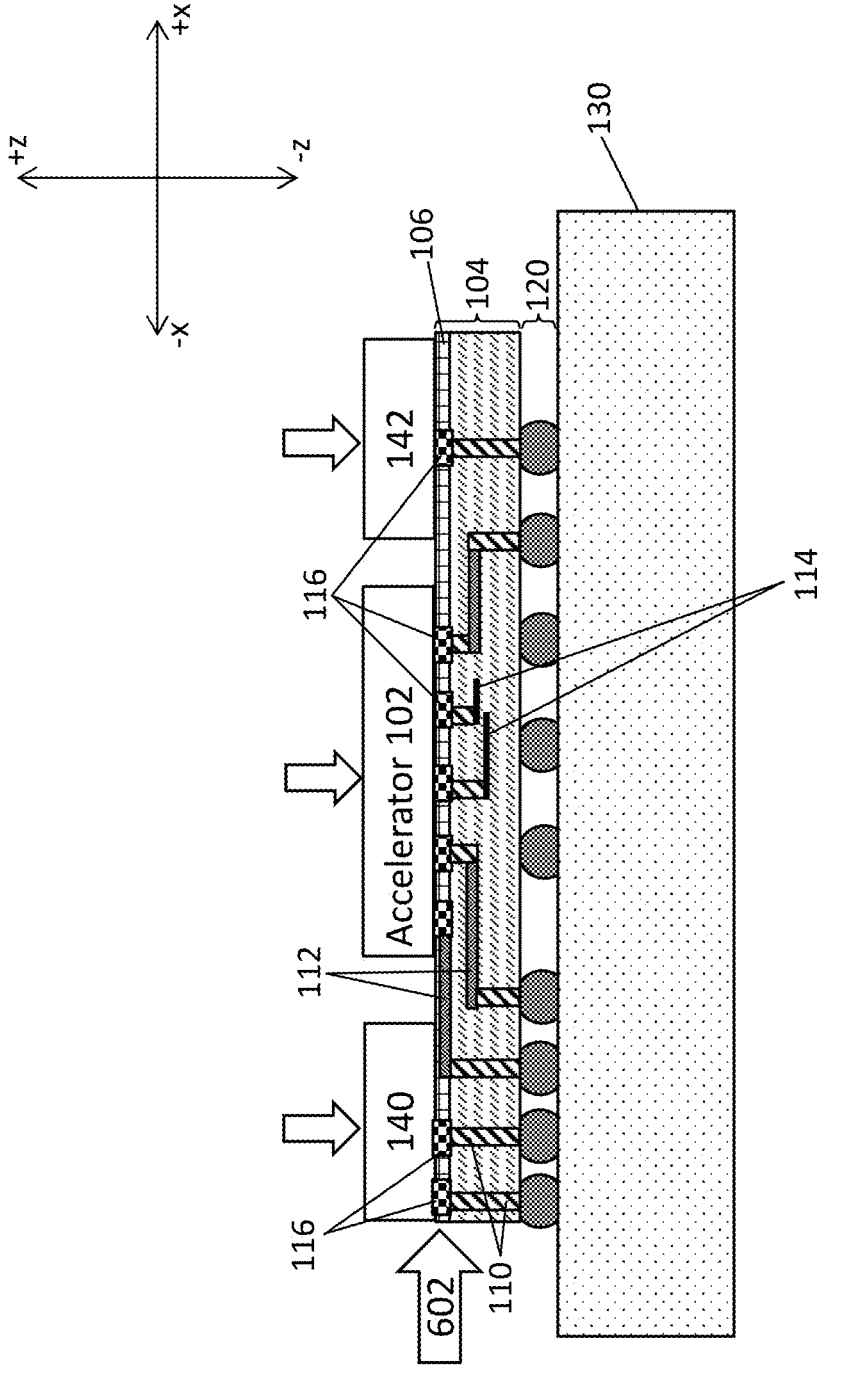
FIG. 6C illustrates another step of the process to form a heterogeneous integration structure with voltage regulation in one embodiment.

FIG. 6A to FIG. 6C illustrate a process to form structure 100 of FIG. 1 in one embodiment. In FIG. 6A. TSVs 110 can be formed on frame 402 (see FIG. 4) of memory power chip 104 using various etching and/or material removal techniques. TSVs 110 can be capped using, for example, deposition techniques. Solder bumps 120 can be attached to memory power chip 104 with TSVs 110, and BEOL wires (e.g., thick BEOL wires 112 and fine BEOL wires 114 in FIG. 1). In one embodiment, solder bumps 120 can be attached to locations of memory power chip 104 where there are TSVs 110.

In FIG. 6B, memory power chip 104 with the solder bumps 120 can be attached to substrate 130. In one embodiment, solder bumps 120 can be attached to dummy pads (not shown) on substrate 130 for uniformity or co-planarity purposes.

In FIG. 6C, components such as accelerator 102 and VRMs 140, 142 can be attached to a top surface of memory power chip 104. In one embodiment, accelerator 102 can be attached to memory power chip 104 using interconnects 116 in a face-to-face (F2F) configuration. In one embodiment, if interconnect 116 are solder-based, then underfill 602 can be applied to openings between accelerator 102 and memory power chip 104 to ensure coverage between accelerator 102 and the memory portion 404 (see FIG. 4) of memory power chip 104. If interconnect 116 are Cu—Cu bonds, then underfill 602 is not needed. VRMs 140, 142 can be attached to TSVs 110 using Cu—Cu bonds or solder interconnects, such as interconnects 116. In one embodiment, underfill 602 can be pre-applied on the top surface of memory portion 404 before attaching accelerator 102.

Figure 7:
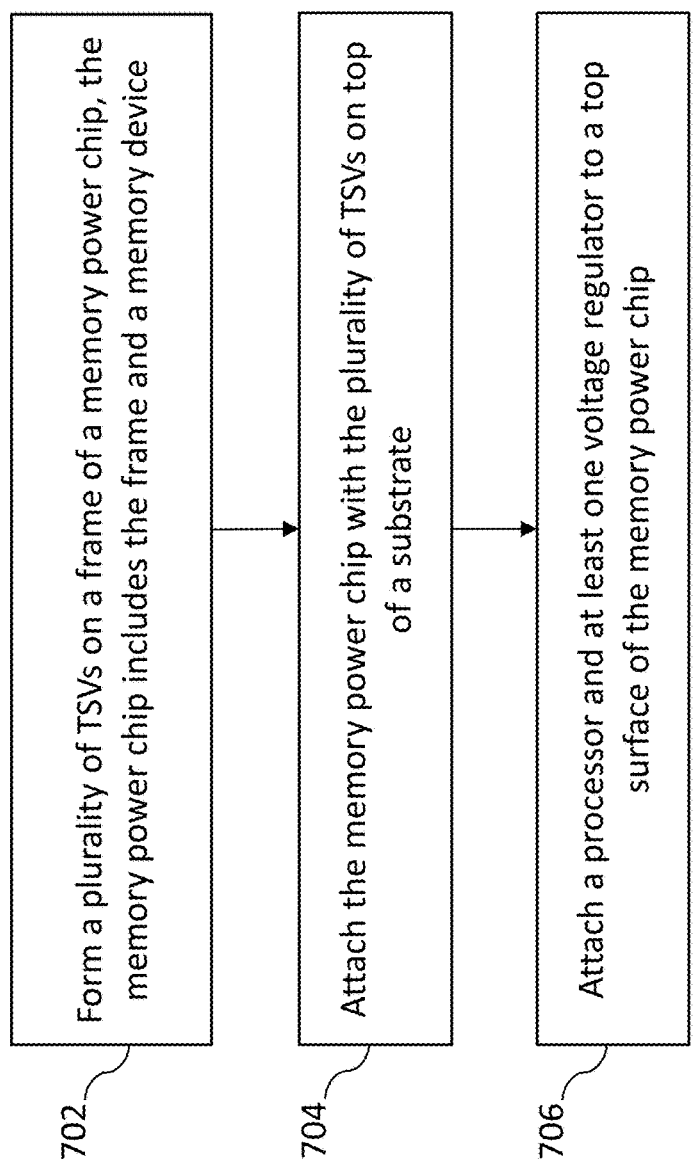
FIG. 7 illustrates a flow diagram relating to heterogeneous integration structure with voltage regulation in one embodiment.

FIG. 7 illustrates a flow diagram relating to heterogeneous integration structure with voltage regulation in one embodiment. The process 700 in FIG. 7 may be implemented to form, for example, structures 100, 200, 300 discussed above. The process 700 can include one or more operations, actions, or functions as illustrated by one or more of blocks 702, 704, and/or 706. Although illustrated as discrete blocks, various blocks may be divided into additional blocks, combined into fewer blocks, eliminated, performed in different order, or performed in parallel, depending on the desired implementation.

Process 700 can begin at block 702. At block 702, a plurality of TSVs can be formed on a frame of a memory power chip. The memory power chip can include the frame and a memory device. In one embodiment, the memory device can be a 3D stacked memory device. Process 700 can proceed from block 702 to block 704. At block 704, the memory power chip with the plurality of TSVs can be attached on top of a substrate.

Process 700 can proceed from block 704 to block 706. At block 706, a processor and at least one voltage regulator can be attached to a top surface of the memory power chip. In one embodiment, the processor can be an accelerator configured to perform a specific task of an artificial intelligence application using data stored in the memory device. In one embodiment, attaching the processor to the top surface of the memory power chip can include attaching a face of the processor to a face of the memory device of the memory power chip. In one embodiment, at least one optical chip can be attached to the top surface of the memory power chip.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be implemented substantially concurrently, or the blocks may sometimes be implemented in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A semiconductor device comprising:
a chip including a memory device and a plurality of through-silicon-vias (TSVs);

a processor arranged on top of the chip, wherein the processor is configured to communicate with the memory device via a plurality of interconnects;

at least one voltage regulator arranged on top of the chip, the at least one voltage regulator being configured to regulate power being provided from the plurality of TSVs to the processor; and at least one optical chip configured to transfer regulated voltage from the at least one voltage regulator to the processor.

2. The semiconductor device of claim 1, wherein the at least one voltage regulator includes:

a first voltage regulator configured to regulate power being provide from the plurality of TSVs to the processor; and a second voltage regulator configured to regulate power being provide from the plurality of TSVs to the memory device.

3. The semiconductor device of claim 1, wherein the at least one voltage regulator is configured to output regulated power to the processor via back-end-of-line (BEOL) wires.

4. The semiconductor device of claim 1, wherein:

the chip is arranged on top of a substrate;

the semiconductor device further includes another memory device arranged on top of the substrate; and a memory controller is embedded in the chip, the memory controller being configured to perform memory operations between the memory device and said another memory device.

5. The semiconductor device of claim 1, wherein the chip and the processor are connected in a face-to-face (F2F) configuration.

6. The semiconductor device of claim 1, wherein the plurality of TSVs are arranged on a periphery of the chip.

7. The semiconductor device of claim 1, wherein the memory device in the chip is a three-dimensional (3D) stacked memory device.

8. A semiconductor device comprising:

a chip arranged on top of a substrate, the chip including a memory device and a plurality of through-silicon-vias (TSVs), the memory device being configured to store data associated with an artificial intelligence application;

an accelerator arranged on top of the chip, wherein the accelerator is configured to communicate with the memory device via a plurality of interconnects, and the accelerator is configured to use data stored in the memory device to perform a specific task for the artificial intelligence application;

at least one voltage regulator arranged on top of the chip, the at least one voltage regulator being configured to regulate power being provided from the plurality of TSVs to the accelerator; and at least one optical chip configured to transfer regulated voltage from the at least one voltage regulator to the accelerator.

9. The semiconductor device of claim 8, wherein the at least one voltage regulator includes:

a first voltage regulator configured to regulate power being provide from the plurality of TSVs to the accelerator; and a second voltage regulator configured to regulate power being provide from the plurality of TSVs to the memory device.

10. The semiconductor device of claim 8, wherein the at least one voltage regulator is configured to output regulated power to the accelerator via back-end-of-line (BEOL) wires.

11. The semiconductor device of claim 8, further comprising another memory device arranged on top of the substrate, wherein a memory controller is embedded in the chip, and the memory controller is configured to perform memory operations between the memory device and said another memory device.

12. The semiconductor device of claim 8, wherein the chip and the accelerator are connected in a face-to-face (F2F) configuration.

13. The semiconductor device of claim 8, wherein the plurality of TSVs are arranged on a periphery of the chip.

14. The semiconductor device of claim 8, wherein the memory device in the chip is a three-dimensional (3D) stacked memory device.

15. A method comprising:

forming a plurality of TSVs on a frame of a memory power chip, wherein the memory power chip includes the frame and a memory device;

attaching the memory power chip with the plurality of TSVs on top of a substrate;

attaching a processor and at least one voltage regulator to a top surface of the memory power chip; and attaching at least one optical chip to the top surface of the memory power chip.

16. The method of claim 15, wherein the processor is an accelerator configured to perform a specific task of an artificial intelligence application using data stored in the memory device.

17. The method of claim 15, wherein attaching the processor to the top surface of the memory power chip comprises attaching a face of the processor to a face of the memory device of the memory power chip.

* * * * *